US009612261B2

(12) United States Patent
Rayon et al.

(10) Patent No.: US 9,612,261 B2
(45) Date of Patent: Apr. 4, 2017

(54) PROCESSOR DEVICE FOR PROCESSING SIGNALS IN AN ELECTRICAL INSTALLATION

(71) Applicant: ALSTOM Technology Ltd, Baden (CH)

(72) Inventors: Jean-Luc Rayon, Montanay (FR); Guillaume Granelli, Seez (FR); Jean-Francois Mironneau, Lyons (FR)

(73) Assignee: ALSTOM TECHNOLOGY LTD, Baden (CH)

( * ) Notice: Subject to any disclaimer, the term of this patent is extended or adjusted under 35 U.S.C. 154(b) by 27 days.

(21) Appl. No.: 14/764,643

(22) PCT Filed: Feb. 5, 2014

(86) PCT No.: PCT/EP2014/052233
§ 371 (c)(1),
(2) Date: Jul. 30, 2015

(87) PCT Pub. No.: WO2014/122168
PCT Pub. Date: Aug. 14, 2014

(65) Prior Publication Data
US 2015/0369846 A1 Dec. 24, 2015

(30) Foreign Application Priority Data

Feb. 6, 2013 (FR) ..................... 13 51003

(51) Int. Cl.
*G01R 15/18* (2006.01)
*G01R 31/327* (2006.01)
(Continued)

(52) U.S. Cl.
CPC ....... *G01R 15/181* (2013.01); *G01R 19/2513* (2013.01); *G01R 31/3271* (2013.01); *H02H 3/044* (2013.01)

(58) Field of Classification Search
CPC . G01R 1/20; G01R 1/22; G01R 1/203; G01R 15/146; G01R 19/0007
See application file for complete search history.

(56) References Cited

U.S. PATENT DOCUMENTS 4,484,134 A * 11/1984 Halloran ............ G01N 15/1218
324/71.1
4,484,136 A 11/1984 Tuttle
(Continued)

FOREIGN PATENT DOCUMENTS

EP 0 788 207 A1 8/1997

OTHER PUBLICATIONS

Chatrefou D., et al., Interoperability Between Non Conventional Instrument Transformers (NCIT) and Intelligent Electronic Devices (IDE); May 21, 2006; 6 pp; IEEE, Piscataway, NJ, USA.
(Continued)

Primary Examiner — Tung X Nguyen
(74) Attorney, Agent, or Firm — Nixon Peabody, LLP; Khaled Shami

(57) ABSTRACT

A signal processor device comprising: first input means intended to be connected, via a measurement sensor, to a high-voltage signal of an electrical installation; and processor means for analyzing the signal measured by said sensor; the device further comprising:
changeover means that are configured to cause the operation of the device to change between a test mode in which the device is disconnected from said high-voltage signal so as to be connected to a test signal, and an operating mode in which the device is disconnected from said test signal so as to be reconnected to said high-voltage signal; and
second input means that are connected to said processor means, said processor means being configured to actuate said changeover means so that the device operates
(Continued)

in test mode or in operating mode depending on whether the second input means are activated or de-activated respectively.

10 Claims, 3 Drawing Sheets

(51) Int. Cl.
*G01R 19/25* (2006.01)
*H02H 3/04* (2006.01)

(56) References Cited

U.S. PATENT DOCUMENTS

| | | |
|---|---|---|
| 5,986,860 A | 11/1999 | Scott |
| 6,236,548 B1 | 5/2001 | Marmonier |
| 2004/0012901 A1 | 1/2004 | Kojovic et al. |
| 2005/0243484 A1* | 11/2005 | Kim .................. H02H 3/335 |
| | | 361/42 |
| 2007/0014060 A1 | 1/2007 | Land et al. |
| 2008/0129307 A1 | 6/2008 | Yu et al. |
| 2010/0321836 A1 | 12/2010 | Dvorak et al. |

OTHER PUBLICATIONS

International Search Report for PCT Application No. PCT/EP2014/052233 dated Mar. 5, 2014.
Preliminary French Search Report for French Application No. 13 51003 dated Oct. 16, 2013.
Office Action dated Oct. 3, 2016 for U.S. Appl. No. 13/806,099.

* cited by examiner

PROCESSOR DEVICE FOR PROCESSING SIGNALS IN AN ELECTRICAL INSTALLATION

CROSS-REFERENCE TO RELATED PATENT APPLICATION

The present application is a National Stage Application of International Application No. PCT/EP2014/052233 entitled "DEVICE FOR SIGNAL PROCESSING IN AN ELECTRICAL INSTALLATION" filed Feb. 5, 2014, which claims priority to French Patent Application Number 13 51003 filed Feb. 6, 2013, the contents of which are incorporated herein by reference in their entirety.

TECHNICAL FIELD

The present invention generally relates to power electronics and to measuring and processing electrical parameters in an electrical installation.

STATE OF THE PRIOR ART

An electrical installation, e.g. an AC generator or an electricity substation, is an element of the electricity network that is used to produce, transmit, or distribute electricity. For example, electricity substations are situated at the ends of electricity transmission or distribution lines, i.e. at the ends of electricity networks.

An electricity substation includes several electronic converter stages that make it possible to reduce a high voltage coming from high-voltage cables into a standardized voltage in order to supply it to consumers.

The input of an electronic converter stage is referred to as the primary bus that is itself connected to the high-voltage lines that enter the electrical installation, while the output of the stage is referred to as the secondary bus that is connected to the secondary voltage lines that leave the substation.

Knowledge of the value of the high-voltage electrical signal is necessary in order to estimate the quality of the rectification performed and in order to implement modulation techniques for controlling chopping.

For this purpose, specific current sensors are incorporated in electricity substations, on the primary bus, or on the secondary buses.

In order to provide accurate and reliable measurements of the current, it is conventional to use zero-flux type sensors, also referred to as conventional sensors, i.e. with magnetic cores.

Zero-flux sensors use the Hall effect principle to measure a voltage that is proportional to the current by means of secondary measurement toruses that are isolated from the primary bus in which the current flows. Flux cancellation electronics make it possible to cancel the continuous magnetic flux and thus avoid saturating the magnetic cores.

Such sensors are capable of measuring alternating and complex current waveforms, while ensuring isolation. In addition, they present the advantage of having large bandwidth from direct current (DC) up to a few tens of kilohertz (kHz).

However, for DC, measuring current with "zero-flux" type sensors is limited to voltages of about 500 kilovolts (kV), since at higher voltages, providing insulation between the primary and secondary toruses is prohibitive in terms of cost, weight, and bulkiness, and uncontrolled magnetic effects may make the sensor thermally unstable and potentially dangerous. Insulation between the primary and secondary toruses uses liquids or gases under pressure.

Novel sensor technologies or measurement transformers for exceeding the threshold of 500 kV have appeared. They do not include magnetic cores and they are commonly referred to as non-conventional sensors or non-conventional instrument transformers (NCITs).

In the field of use of NCIT sensors, the high-voltage signal coming from the primary bus requires a measurement system that performs specific processing.

The processing is performed by a signal processor device that is connected through an Ethernet-based communications network in order to convey the values to the protective relays and other equipment of the electrical installation.

In terms of safety in operation, validating the connection is imperative, and validating the information path is essential.

However, a point-to-point wiring test is not possible since electronic elements such as switches may be situated in the Ethernet structure.

Currently, in order to verify the integrity of the network, an operator modifies the operation of the processor device by causing it to pass into test mode. The operator disconnects the NCIT sensor that measures the current and/or the voltage and, in its place, injects a reference signal with which different tests are performed.

During this verification, the operator might make mistakes, e.g. erroneously triggering the actuation of the protective relays, or damaging the sensor, forgetting to reconnect certain sub-elements together, or reconnecting them incorrectly. Such operations also require the operation of the electrical installation to be interrupted for the duration of the verification, and this is extremely costly.

Furthermore, the use of electronics in the proximity of the high-voltage (HV) zone is tricky.

The object of the present invention is to remedy the above-mentioned drawbacks by proposing a processor device that is safer, and that makes it possible, in particular, to avoid making such mistakes.

SUMMARY OF THE INVENTION

This object is achieved by a signal processor device comprising: first input means intended to be connected, via a measurement sensor, to a high-voltage signal of an electrical installation; and processor means for analyzing the signal measured by said sensor; the device further comprising:
  changeover means that are configured to cause the operation of the device to change between a test mode in which the device is disconnected from said high-voltage signal so as to be connected to a test signal, and an operating mode in which the device is disconnected from said test signal so as to be reconnected to said high-voltage signal; and
  second input means that are connected to said processor means, said processor means being configured to actuate said changeover means, so that the device operates in test mode or in operating mode depending on whether the second input means are activated or de-activated respectively.

This makes it possible to automate the test operation while keeping the complete measurement system uninterrupted, to make the electrical installation safe, and to prevent any mistakes being made by an operator.

In a first embodiment, the second input means include a connector intended to be connected to an injector generator for injecting said test signal. Connection to said injector generator activates the second input means so as to trigger the device to change into test mode, and disconnection from said injector generator de-activates the second input means.

Advantageously, the device includes a protective input interface that is connected to said connector.

In a second embodiment, the device includes a memory storing at least one pre-recorded test signal, and the activation of the second input means triggers the device to change into test mode and the high-voltage signal to be replaced by said pre-recorded test signal.

Advantageously, said changeover means are electronic means and/or software means that are actuated under the control of the processor means.

Advantageously, said test signal is a signal that replicates said high-voltage signal.

Advantageously, the first input means include a power connector intended to be connected to a power source, and a plurality of measurement connectors for connecting to a plurality of measurement sensors.

Advantageously, the device further includes analog-to-digital conversion means for converting the high-voltage signal measured by said sensor into a digital signal, and output means for delivering a digital measurement of said signal.

The invention also provides a measurement system for measuring a physical unit of a high-voltage electrical signal, said system including a processor device according to any preceding characteristic, and at least one non-conventional NCIT sensor that is connected to said processor device via an optical connection.

The invention also provides an electrical installation including the measurement system according to the above-mentioned characteristics.

BRIEF DESCRIPTION OF THE DRAWINGS

Other characteristics and advantages of the invention appear on reading the following description of the preferred embodiment of the invention given by way of non-limiting example and with reference to the accompanying figures, in which.

DETAILED DESCRIPTION OF PARTICULAR EMBODIMENTS

The invention is based on the idea of causing the processor device to pass automatically into test mode.

Figure 1:
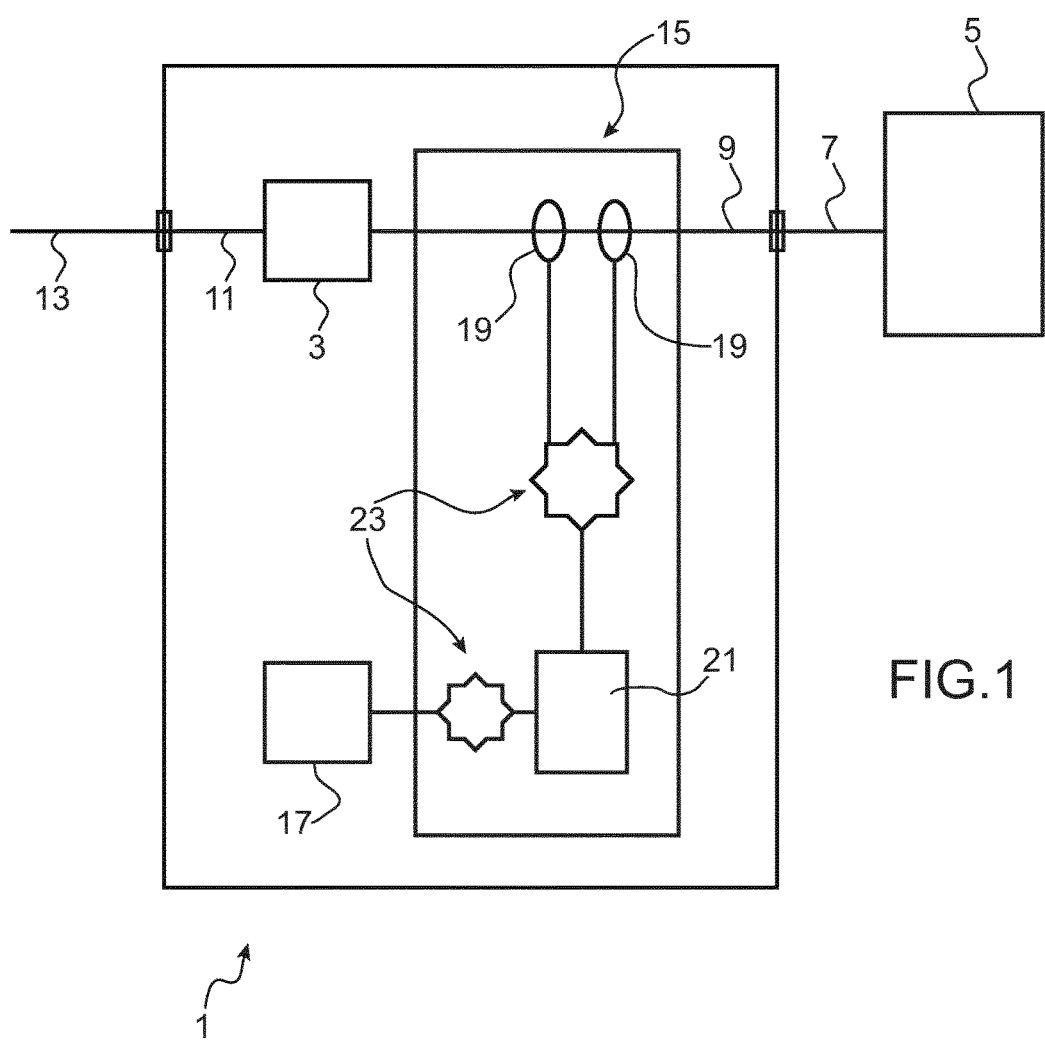
FIG. 1 shows, in diagrammatic manner, an electrical installation including a measurement system of the invention.

FIG. 1 shows, in diagrammatic manner, an electrical installation including a measurement system of the invention.

The electrical installation 1 (e.g. an AC generator or a substation) is an element of the electricity network that is situated at the ends of electricity transmission lines.

An electricity substation type installation includes one or more electronic converter stages 3 that make it possible to reduce a high voltage (of about several tens of kilovolts (kV) or kiloamps (kA)), coming from electricity generator elements 5 via high-voltage cables 7, to a standardized voltage (1/5 amps (A) and 110/220 volts (V)) in order to supply it to consumers via secondary voltage lines.

The input of an electronic converter stage 3 is referred to as the primary bus 9 that is itself connected to the high-voltage lines 7 that enter the electrical installation 1, while the output of a converter stage 3 is referred to as the secondary bus 11 that is connected to the secondary voltage lines 13 that leave the electrical installation 1.

In modern electrical installations such as air insulated sub-stations (AIS) and gas insulated sub-stations (GIS), the converter stages 3 are controlled with high switching frequencies, a fast dynamic range, and voltages of about 800 kV.

Knowledge of the value of the "complete or composite" current signal (i.e. from DC up to the highest AC frequency) makes it possible to estimate the quality of the rectification performed, and to implement modulation techniques so as to control chopping. Accurate knowledge of the value of the current and/or of the voltage then makes it possible to adjust the modulation parameters in optimum manner with a view to blocking or saturating, the semi-conductor switches (of MOSFET, IGBT, or thyristor type) of the converters at the opportune moment.

In addition, in a variable-speed AC-generator type electrical installation (not shown), the generator is generally fitted with inverters/rectifiers that are situated upstream from its rotor. The inverters/rectifiers are used to regulate the speed of rotation of the rotor by sending it a variable-frequency current signal. It should thus be understood that measuring the current signal coming from the inverters/rectifiers is important for managing the power supplied by the generator, and for implementing protection systems.

For this purpose, a measurement system 15 is incorporated in the electrical installation 1 for supplying accurate and reliable measurements of a physical magnitude (current or voltage) of the high-voltage electrical signal of the primary bus. The measurements are supplied to protection and metering equipment 17 (relays and automatic controllers) and to meters (energy meters and quality meters).

Thus, the measurement system 15 includes one or more sensors 19 mounted on the primary bus 9 of the electrical installation 1, and a processor device 21 connected to the sensor(s) 19 via a connection assembly 23.

Advantageously, each sensor 19 is an NCIT-type sensor that is connected to the processor device 21 via an optical connection.

The NCIT sensor does not include a magnetic core and its use is justified by improved accuracy as a result of an absence of magnetic saturation, intrinsic safety, increased compactness, permanent self-monitoring of the sensors, no maintenance, flexibility in using a digital interface, and an overall reduction in cost.

In the NCIT field, several technological solutions for sensors exist, and the choice depends on the match between the ease of incorporation, the proper cost of the sensors, and their associated performance.

Thus, NCIT sensors may be Faraday sensors or Rogowski sensors or other types of non-magnetic sensors.

In addition, the measurement system 15 is connected via connections or a communications network 23, e.g. based on 100 megabyte (MB) Ethernet, that is/are also used to convey the values to the protection, monitoring, and control equipment 17 of the electrical installation 1.

In the communications network 23, the data is preferably transmitted via optical fiber. Optical fibers are insensitive to hostile environments and present very low thermal conductivity, thereby contributing to the accuracy of the measurements and to safety.

Furthermore, the optical fiber connection makes it possible to place the processor device 21 at a certain safety distance relative to the high-voltage primary bus 9. It is thus possible to define a high-voltage HV zone close to the primary bus 9, and a low-voltage LV zone close to ground where the processor device 21 and the protection and monitoring equipment 17 are situated. Thus, only the low-voltage LV zone contains the elements likely to be affected by a failure.

The insulation of the high-voltage HV portion and the descent of the optical fibers are achieved by a resin and silicon rubber type composite insulator containing the working optical fibers. Such insulation is inexpensive and non-flammable.

Figure 2:
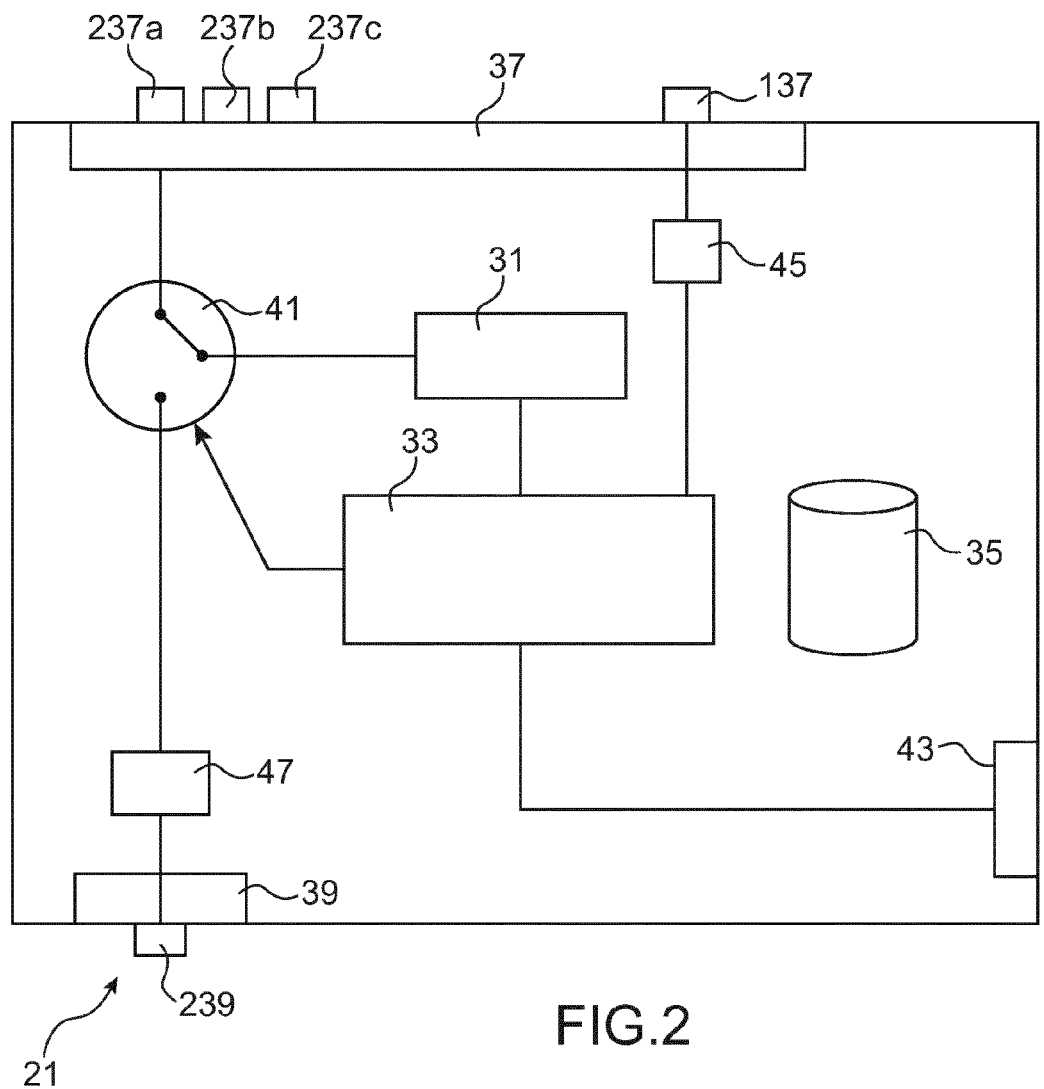
FIG. 2 shows, in diagrammatic manner, the processor device of the invention.

FIG. 2 shows, in diagrammatic manner, the processor device of the invention.

In accordance with the invention, the processor device 21 comprises analog-to-digital conversion means 31, processor means 33, memory means 35 including calibration parameters, first input means 37, second input means 39, changeover means 41, and output means 43.

The first input means 37 include a power connector 137 for connecting to an AC or DC power source (not shown) coming from the electrical installation. The power connector 137 powers the processor means 33 via an AC/DC or DC/DC converter 45.

Furthermore, the first input means 37 include one or more measurement connectors 237a, 237b, 237c for connecting to one or more measurement sensors 19 mounted on the primary bus 9 of the electrical installation 1 so as to measure a high-voltage signal.

The analog-to-digital conversion means 31 are for converting the high-voltage signal measured by each sensor 19 into a digital signal that is then analyzed by the processor means 33. The processor means make it possible to perform processing with great precision of about 32 bits, at a sampling frequency that may be about 20 kilohertz (kHz).

Then, the output means 43 deliver the processed digital measurement of the signal to the communications network 23 that conveys it to the protection and monitoring equipment 17 of the electrical installation 1, and to other equipment thereof.

In order to verify the integrity of the measurement system and the validity of the information path, a test signal is used that replicates the high-voltage signal that may be sinusoidal. The test signal is a signal of low level in terms of current or voltage amplitude, but is of the same form as the high-voltage signal in terms of frequency. The test operation makes it possible to verify the structure of the communications network 23, and to test all of the system from the sensors 19 to the protection and monitoring equipment 17 that may be very far away from the sensors. Thus, before starting up the electrical installation 1, the test operation enables an operator to verify that the measurements coming from the sensors 19 are going to be well received by the protection and monitoring equipment 17.

In accordance with the invention, the test operation is performed automatically by the processor device 21.

The changeover means 41 are configured to cause the operation of the processor device 21 to change between a test mode (or first mode) and an operating mode (or second mode) as a function of the activation or de-activation of the second input means 39. In the first mode, the processor device 21 is disconnected from the high-voltage signal that is measured by each sensor 19 so as to be connected to a test signal. In this situation, the test signal is converted into a digital signal by the analog-to-digital conversion means 31 before being used by the processor means 33. In contrast, in the second mode, the processor device 21 is disconnected from the test signal so as to be reconnected to the high-voltage signal coming from each sensor 19.

Naturally, the second input means 39 are connected to the processor means 33 so that said processor means detect the activation or de-activation of the input means 39.

Thus, the processor means 33 are configured to actuate the changeover means 41, such that the processor device 21 operates in first mode (test mode) when the second input means 39 are activated, or in second mode (operating mode) when the second input means 39 are de-activated. This enables the test signal to be seen by the processor means 33 as if it were coming from the primary bus 9.

The changeover means 41 may be electronic means, e.g. a changeover switch, that are actuated under the control of the processor means 33 once said processor means detect the activation or de-activation of the second input means.

In a variant, the changeover means 41 may be software means that are implemented by the processor means 33 as a function of the activation or de-activation of the second input means 39.

In a first embodiment, activation of the second input means 39 corresponds to injecting a test signal from outside the device 21.

More particularly, the second input means 39 include a test connector 239 for making a connection, via an injector cable (not shown), to an injector generator for injecting the test signal. Thus, the test connector 239 makes it possible to inject an electrical signal from a generator of the Omicron 256 type or similar, directly to a low-level input, which electrical signal may be sinusoidal and replicates the signal of the primary bus.

Connecting the injector generator via the injector cable activates the input means 39, and consequently triggers the device 21 to change into test mode.

Thus, the test connector 39 in association with the processor means 33 makes it possible, when the injector cable is connected, to recognize that connection and to cause the processor device 21 to pass automatically into test mode by using the changeover means 41.

In addition, the test connector 239 in association with the processor means 33 makes it possible, when the injector cable is disconnected, to cause the processor device 21 to return automatically into operating mode by using the changeover means 41.

Advantageously, the device includes a protective input interface 47 that is connected to said test connector 239. The protective interface 47 is a protective barrier between the injector generator and the elements of the processor device 21, enabling the processor means 33 to make use of the injection signal directly.

The protective interface 47 is a converter/isolator that makes it possible to protect and to isolate the elements of the processor device 21 from its surroundings. In other words, it is an electronic barrier that prevents the appearance of transient phenomena in the elements of the processor device 21.

In a second embodiment, the second input means are activated or de-activated by control means (e.g. a key connector) making it possible to use a test signal that is internal to the processor device 21.

In this configuration, the test signal is a test signal that is pre-recorded in the memory means 35, such that the activation of the second input means 39 by the key connector triggers the device 21 to change into test mode and the high-voltage signal to be replaced by the pre-recorded test signal.

Figure 3:
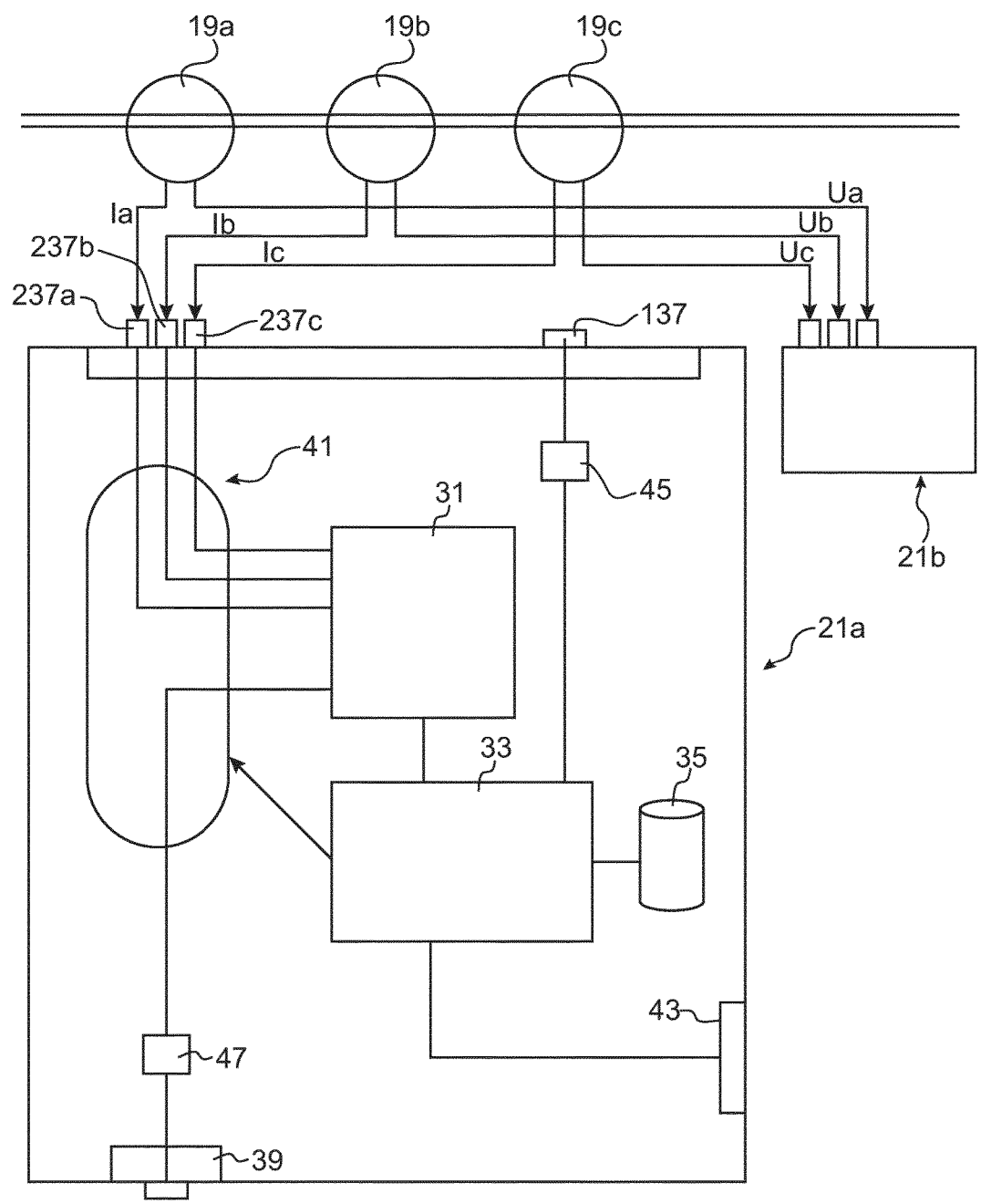
FIG. 3 shows, in diagrammatic manner, a measurement system of the invention including a plurality of sensors.

FIG. 3 shows, in diagrammatic manner, a measurement system of the invention including a plurality of sensors.

The sensors 19a, 19b, 19c are mounted on a primary bus 9 of an electrical installation so as to measure the various phases of current Ia, Ib, Ic or of voltage Ua, Ub, Uc of the high-voltage signal.

In this embodiment, the current and voltage signals are conveyed to first and second processor devices 21a, 21b respectively.

As can be seen in greater detail in the first processor device 21a, the three current signals Ia, Ib, Ic are injected into three measurement connectors 237a, 237b, 237c respectively of the first input means 37.

In an operating mode, the three current signals Ia, Ib, Ic are converted by the analog-to-digital conversion means 31 into digital signals that are then analyzed and multiplexed into a measurement frame by the processor means 33 before being transmitted by the output means 43 to the protection and monitoring equipment via the communications network.

It should be noted that when the sensors are of the Rogowski type, the digital signals coming from the conversion means 31 are integrated by the processor means 33 before being analyzed.

In a test mode, a test signal ST, multiplexed to replicate the three signals Ia, Ib, Ic, is injected by a current generator into the test connector 239. The test signal ST passes via the protective interface 47 before being converted into a digital test signal by the analog-to-digital conversion means 31. The digital test signal is seen by the processor means 33 as a signal coming from the primary bus 9. The processor means analyze the signal before it is transmitted by the output means 43 to the protection and monitoring equipment.

It should be observed that when the test signal is injected into the processor device 21a, contact is established between the test connector 239 and the processor means 33, enabling the processor means to actuate the changeover means 41 so that said processor means are connected to the test signal instead of the high-voltage signals.

Thus, the processor device of the invention makes it possible to avoid any connection or disconnection in the measurement system, while using tools that are commonly used in the field of electrical testing.

The invention claimed is:

1. A signal processor device comprising:
   first input means for connection, via a measurement sensor, to a high-voltage signal of an electrical installation; and processor means for analyzing the signal measured by said sensor; the signal processor device further comprises:
   changeover means that are configured to cause the operation of the device to change between a test mode in which the device is disconnected from said high-voltage signal so as to be connected to a test signal, and an operating mode in which the device is disconnected from said test signal so as to be reconnected to said high-voltage signal; and
   second input means that are connected to said processor means, said processor means being configured to actuate said changeover means so that the device operates in test mode or in operating mode depending on whether the second input means are activated or de-activated respectively.

2. A device according to claim 1, wherein the second input means include a connector intended to be connected to an injector generator for injecting said test signal, and in that connection to said injector generator activates the second input means so as to trigger the device to change into test mode.

3. A device according to claim 2, including a protective input interface that is connected to said connector.

4. A device according to claim 1 including a memory storing at least one pre-recorded test signal, and in that the activation of the second input means triggers the device to change into test mode and the high-voltage signal to be replaced by said pre-recorded test signal.

5. A device according to claim 1 wherein said changeover means are electronic means and/or software means that are actuated under the control of the processor means.

6. A device according to claim 1 wherein said test signal is a signal that replicates said high-voltage signal.

7. A device according to claim 1 wherein the first input means include a power connector intended to be connected to a power source, and a plurality of measurement connectors (237a, 237b, 237c) intended to be connected to a plurality of measurement sensors.

8. A device according to claim 1 including an analog-to-digital conversion means for converting the high-voltage signal measured by said sensor into a digital signal, and output means for delivering a digital measurement of said signal.

9. A measurement system for measuring a physical unit of a high-voltage electrical signal, said system including a signal processor device comprising:
   first input means for connection, via a measurement sensor to a high-voltage signal of an electrical installation; and processor means for analyzing the signal measured by said sensor; the signal processor device further comprises:
   changeover means -that are configured to cause the operation of the device to change between a test mode in which the device is disconnected from said high-voltage signal so as to be connected to a test signal, and an operating mode in which the device is disconnected from said test signal so as to be reconnected to said high-voltage signal;
   second input means that are connected to said processor means, said processor means being configured to actuate said changeover means so that the device operates in test mode or in operating mode depending on whether the second input means are activated or de-activated respectively; and
   at least one NCIT sensor that is connected to said processor device via an optical connection.

10. An electrical installation including a measurement system for measuring a physical unit of a high-voltage electrical signal, said system including a signal processor device comprising:
    first input means for connection, via a measurement sensor to a high-voltage signal of an electrical installation; and processor means for analyzing the signal measured by said sensor; the signal processor device further having:
    changeover means that are configured to cause the operation of the device to change between a test mode in which the device is disconnected from said high-voltage signal so as to be connected to a test signal, and an operating mode in which the device is disconnected from said test signal so as to be reconnected to said high-voltage signal;

second input means that are connected to said processor means, said processor means being configured to actuate said changeover means so that the device operates in test mode or in operating mode depending on whether the second input means are activated or de-activated respectively; and at least one NCIT sensor that is connected to said processor device via an optical connection.

\* \* \* \* \*